Oct. 17, 1967
C. W. WAGNER
3,347,799
GOLD-PALLADIUM CONDUCTOR COMPOSITIONS AND CONDUCTORS MADE THEREFROM
Filed July 16, 1964
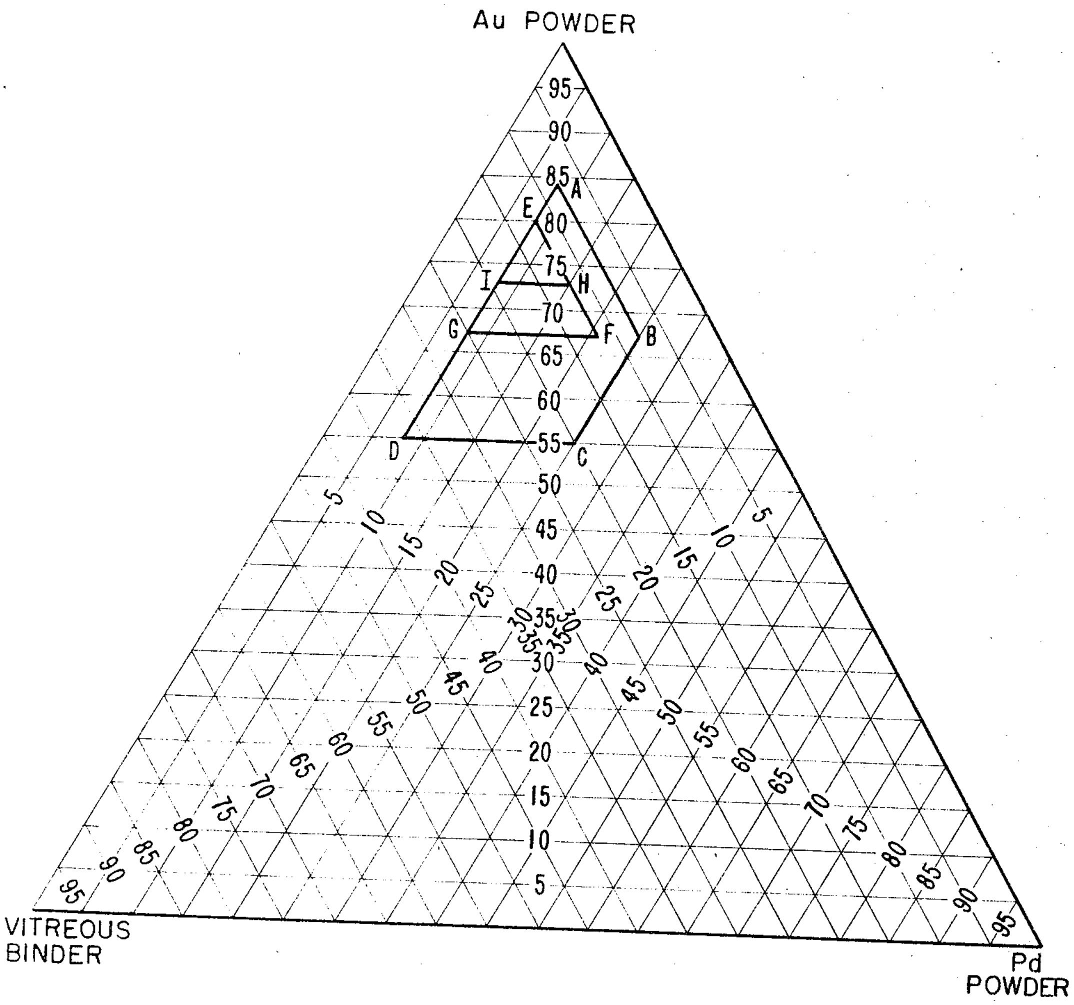
INVENTOR
CHARLES W. WAGNER
BY Amos G. Cole
AGENT United States Patent Office 3,347,799
Patented Oct. 17, 1967

3,347,799
GOLD-PALLADIUM CONDUCTOR COMPOSITIONS AND CONDUCTORS MADE THEREFROM

Charles W. Wagner, Wilmington, Del., assignor to E. I. du Pont de Nemours and Company, Wilmington, Del., a corporation of Delaware Filed July 16, 1964, Ser. No. 383,053
10 Claims. (Cl. 252—514)

This invention relates to conductor compositions for use in electrical circuits which are fired on ceramic bodies. More particularly, it relates to conductor compositions especially useful for preparing connections to or between fired on palladium-based circuit components, which compositions are themselves fired on in use.

Fired on palladium-based resistor components are now widely used. They may be made by printing a palladium-vitreous binder composition, such as is described in D'Andrea U.S. Patent 2,924,540, in a desired pattern onto a ceramic dielectric body or base and then firing to bond the composition to the dielectric body. Such fired on resistor components must be electrically connected to other components, e.g., capacitors, of the circuit and to lead wires. Silver conductor compositions are not suitable for effecting such connections because the fired on silver tends to migrate, particularly in humid atmospheres, and silver tends to result in objectionable gas evolution in the presence of palladium.

Fired on conductor compositions based on mixtures of platinum and gold powders are used to some extent. They are advantageous over silver-based compositions in that they present no metal migration problem and do not result in gas-evolving reactions in contact with palladium-based resistors. However, the platinum-gold compositions are quite costly and produce quite characteristically, undesirable noise effects in the circuit. A further distinct disadvantage is that fired on films resulting from such compositions exhibit quite poor adherence and soldering properties, particularly when firing is effected at temperatures substantially below 1000° C. Thus, the present platinum-gold conductor compositions are far from ideal in several respects.

It is an object of the invention to provide improved conductor compositions for producing fired on electrically conductive films or electrical connections between or to circuit components fired on a dielectric ceramic base. A particular object of the invention is to provide such compositions which are especially well suited for producing fired on connections for fired on palladium-based circuit components, particularly resistors. Another object is to provide articles comprising a dielectric ceramic base having fired thereon the above improved conductor composition, e.g., as a connection to a fired on palladium-based electrical component. Still further objects will be apparent from the following description.

The conductor compositions of the invention may be prepared by mixing together in the proportions indicated hereinafter finely divided palladium, finely divided gold and a finely divided vitreous binder. Firing of the finely divided mixture on a dielectric ceramic base or body fuses the binder and firmly bonds the particles of the metal components together and to the dielectric body and yields a highly conductive readily solderable metal film. Such films, which consist of the metal particles dispersed in a glass matrix, serve admirably as conductor elements, e.g., as connectors for fired on palladium-based circuit components such as resistor components.

The details of the invention will be apparent from the following description considered in connection with the accompanying drawing.

The drawing shows a triaxial diagram for the system Palladium Powder-Gold Powder-Vitreous Binder in which each apex represents 100% of one of the 3 components and any point in the diagram represents a mixture of the 3 components in amounts totalling 100%.

The proportions of palladium powder, gold powder and vitreous binder in the conductor compositions of the invention are as follows:

| | Proportions in Weight Percent | | |
|---|---|---|---|
| | Operable | Preferred | Most Preferred |
| Palladium powder | 8–25 | 8–21 | 8–15 |
| Gold powder | 55–84 | 67–80 | 73–80 |
| Vitreous binder | 8–37 | 12–25 | 12–19 |

The operable compositions are represented by the trapezoidal area ABCD of the triaxial diagram, the preferred compositions are those of the triangular area EFG while the most preferred compositions are those represented by the triangular area EHI of the diagram.

The presence of palladium in the conductor composition has been found to be essential in order to obtain noise-free junctions with the important fired on palladium-based resistors of the above D'Andrea patent. Thus, if the palladium of the present composition is replaced by platinum, the resulting junction with the palladium-based resistor represents an abrupt discontinuity in the circuit, at which discontinuity electrons are in an excited state giving rise to small and sporadic current and voltage fluctuations which find their way into other parts of the circuit as spurious signals or noise.

A palladium content of at least 8% is essential, otherwise the fired on film will not solder satisfactorily. However, if the palladium content of the 3 component composition exceeds 25%, the composition fails because of its high electrical resistance (more than 0.1 ohm/square/mil) and because soldering becomes increasingly difficult. To obtain good solderability, the composition should contain at least 55% but not more than 84% gold. At more than 84% gold, the composition fails because of rapid dissolution in the solder bath (commonly about 60% Pb, 40% Sn), the gold becoming dissolved out before any build up of solder can occur.

If the vitreous binder content is less than 8%, the fired on film will not adhere adequately to the ceramic base. Referring to the diagram, at the 8% vitreous binder line, the adhesion value is about 300–400 p.s.i., which is about the minimum judged usable. As the vitreous binder content is increased and passes the 12% line, the adhesion increases to about 700 p.s.i. which is significant because above this value soldered on wire tends to pull out of the solder rather than the fired on film pulling off the ceramic base. However, if the binder content is increased to more than 37% the composition fails because there is insufficient metal present to result in any significant amount of solder wetting and the conductivity of the fired on film will be poor.

In general, the proportions of the 3 components within the composition ranges indicated above can be varied to yield the best compromise of properties for a given end use. Thus, compositions containing about 12% vitreous binder will adhere well to the ceramic base; those containing at least 12% binder and at least 67% of gold (area EFG of the diagram) will exhibit excellent adhesion and low electrical resistance, and those containing at least 12% binder and at least 73% gold (area EHI of the diagram) will exhibit excellent adhesion and be the least resistant. If extra adhesion is desired and some loss in conductivity and solderability can be tolerated, compositions represented by the lower left corner of area ABCD of the diagram are indicated.

The gold and palladium powder components may be powders produced by either chemical or mechanical methods. Thus, gold powders produced by the reduction of chlorauric acid solution with ferrous sulfate or hydrazine sulfate are satisfactory as is also mechanically comminuted gold. No great difference was found between these types of gold even though there are large differences in particle size. Thus, mechanically comminuted gold of about 5 micron average particle size and gold powder of about 0.2 micron average particle size produced by the reduction of gold chloride solution are equally useful. Similarly, no essential differences in utility were noted between mechanically comminuted palladium powder and powders formed by the reduction of ammoniacal or caustic soda solutions of $PlCl_2$ with hydrazine sulfate or formic acid.

The vitreous binder component should be one which will fuse to a smooth continuous glass phase at a temperature below the melting point of either of the metal components. Various glass frits such as lead, cadmium, barium, calcium or other borate or borosilicate frits can be used. Such frits are generally prepared by melting a glass batch composed of the desired metal oxides, or compounds which will yield them during melting, and pouring the melt into water. The coarse frit is then milled, e.g., in a ball mill with water, to the desired fineness. Preferably, the frit is milled with an amount of $Bi_2O_3$, or a compound such as bismuth subnitrate which will yield $Bi_2O_3$ during firing, such that the final vitreous binder will contain 75 to 95%, most preferably 80 to 90%, $Bi_2O_3$ by weight. The frit that is milled with the $Bi_2O_3$ is most preferably one consisting essentially of 50 to 73% PbO, 5 to 30% $PbF_2$ and 13 to 27% $B_2O_3$, since such a frit gives a wider firing temperature range than do other frits. The $Bi_2O_3$ may be melted with the glass to make a single frit phase, or it may be used as a mixture with preformed frits.

Table 1 gives illustrative frit compositions that are suitable. In the table and elsewhere in the specification all composition percentages are by weight.

TABLE 1.—FRIT COMPOSITIONS

| | (1) | (2) | (3) | (4) | (5) | (6) | (7) |
|---|---|---|---|---|---|---|---|
| $SiO_2$ | 12.7 | ------ | 14.3 | 1.8 | 9.9 | 12.9 | ------ |
| $B_2O_3$ | 16.8 | 10.0 | 10.1 | 1.9 | 10.5 | 19.2 | 20.0 |
| $Na_2O$ | 7.3 | ------ | 1.0 | ------ | ------ | ------ | ------ |
| CdO | 63.2 | 90.0 | ------ | ------ | ------ | ------ | ------ |
| PbO | ------ | ------ | 74.6 | 15.0 | 79.6 | 27.0 | 65.0 |
| $Bi_2O_3$ | ------ | ------ | ------ | 81.3 | ------ | ------ | ------ |
| ZnO | ------ | ------ | ------ | ------ | ------ | 40.4 | ------ |
| $Li_2O$ | ------ | ------ | ------ | ------ | ------ | 0.5 | ------ |
| $PbF_2$ | ------ | ------ | ------ | ------ | ------ | ------ | 15.0 |

All components of the above frits were melted together and fritted by pouring into water, and the resulting coarse frit was then ball milled. Various of the above frits were used as reported hereinafter to prepare palladium-gold conductor compositions. In those instances where no $Bi_2O_3$ is shown in Table 1 as a component, $Bi_2O_3$ was milled with a frit of the composition shown in such an amount as to give a milled vitreous binder mixture containing 80 or 90% $Bi_2O_3$. The $Bi_2O_3$, whether melted into the frit or used as a mixture therewith, so increases the density of the vitreous binder that it tends to settle to the bottom of the conducor composition during firing, thus producing a region of high glass concentration at the junction of the composition and the ceramic substrate which increases adherence to the substrate.

The conductor composition is conveniently applied in the desired pattern to the ceramic base as a suspension in a liquid vehicle. Any inert liquid may be used as the vehicle. Water may be used but organic squeegee vehicles are preferred. Such organic vehicles will generally consist of an organic solvent with or without a thickening agent or temporary binder dissolved therein. Examples of such solvents are methyl, ethyl, propyl, butyl and higher aliphatic alcohols and the corresponding esters, e.g., the acetates and propionates; pine oil, the terpineols and the like. Examples of thickening agents are ethyl cellulose, polyisobutylene, polyvinyl alcohol, polyvinyl acetate and the polymethacrylates of the 1 to 4 carbon aliphatic alcohols. The weight ratio of the conductor composition to vehicle will generally range from 1.5–5:1, the preferred range being 3–5:1.

Various compositions were prepared employing finely divided palladium, finely divided gold and a finely divided vitreous binder in varying proportions. All were suspended in a vehicle consisting of 8% ethyl cellulose and 92% beta-terpineol. The ethyl cellulose used had an ethoxy content of about 45.5% and a viscosity of 10 centipoises for a 5% solution in an 80:20 mixture of toluene and ethanol. The palladium and gold powders had particle sizes ranging from about 0.01 to 10 microns, with an average of about 0.2 micron. The vitreous binders had particle sizes ranging from about 1 to 40 microns, with an average of about 10 microns. The weight ratio of conductor composition to vehicle was the same in all cases, i.e., 4:1, so as to insure obtaining films of the same fired thickness. The dispersions were roll milled, and prints thereof made through a 165 mesh (U.S. Standard Sieve Scale) stainless steel screen onto 96% alumina substrates were fired at 760° C. for 10 minutes. Solderability and adhesion tests were run on circular patterns of known area of the prints so that adhesion values could be calculated, and electrical resistances were determined on long paths consisting of "400 squares" of 1/16 inch wide lines so as to minimize probe effects and give high enough values to be read easily on an ohmmeter or electrometer.

The conductor compositions used and the test results obtained are reported in Table 2 in which all parts (pts.) are by weight. The palladium powder was prepared by the reduction of an ammoniacal $PdCl_2$ solution (12.5% $PdCl_2$, 1% $NH_3$) with an 8% hydrazine sulfate solution. The gold powder used was prepared by the reduction of an auric chloride solution (11.5% $AuCl_3$) with a 10% solution of ferrous sulfate. The vitreous binder used in Examples 1 to 12 and 16 to 20 consisted of 80% $Bi_2O_3$ and 20% of frit 7 of Table 1. The vitreous binder used in Example 13 consisted of 80% $Bi_2O_3$ and 20% of frit 1 of Table 1. The vitreous binder of Example 14 consisted of 90% $Bi_2O_3$ and 10% of frit 5, while the binder of Example 15 consisted of 90% $Bi_2O_3$ and 10% of frit 6 of Table 1.

Solderability determinations were made using a solder containing 60% lead and 40% tin. Adhesion value were determined by peeling a soldered wire (diameter, 0.025 in.) from a 0.12 sq. in. soldered circle and measuring the pull required. Resistance measurements, using a Keithley Electrometer were run on long paths of "400 squares" of 1/16 inch width. All firings were at 760° C. for 10 minutes, although similar results were obtained at temperatures up to 1000° C. for 10 minutes.

TABLE 2

| Example No. | (1) | (2) | (3) | (4) | (5) | (6) | (7) | (8) | (9) | (10) |
|---|---|---|---|---|---|---|---|---|---|---|
| Palladium, pts | 10 | 15 | 20 | 10 | 15 | 20 | 10 | 15 | 20 | 10 |
| Gold, pts | 80 | 75 | 70 | 75 | 70 | 65 | 70 | 65 | 60 | 65 |
| Vitreous Binder, pts | 10 | 10 | 10 | 15 | 15 | 15 | 20 | 20 | 20 | 25 |
| Vehicles, pts | 25 | 25 | 25 | 25 | 25 | 25 | 25 | 25 | 25 | 25 |
| Solderability | Exc. | Exc. | Exc. | Exc. | Exc. | Exc. | Exc. | Exc. | Exc. | Good |
| Adhesion, p.s.i | 525 | 515 | 500 | 725 | 734 | 755 | 812 | 810 | 843 | 905 |
| Resistance, ohms per sq. per mil | 0.020 | 0.030 | 0.055 | 0.020 | 0.040 | 0.050 | 0.040 | 0.050 | 0.060 | 0.050 |

| Example No. | (11) | (12) | (13) | (14) | (15) | (16) | (17) | (18) | (19) | (20) |
|---|---|---|---|---|---|---|---|---|---|---|
| Palladium, pts | 15 | 10 | 18.5 | 13 | 22.9 | 10 | 20 | 30 | 30 | 30 |
| Gold, pts | 60 | 60 | 67.7 | 71 | 59.9 | 50 | 50 | 50 | 55 | 60 |
| Vitreous Binder, pts | 25 | 30 | 13.8 | 16 | 17.2 | 40 | 30 | 20 | 15 | 10 |
| Vehicle, pts | 25 | 25 | 23.3 | 50 | 52.6 | 25 | 25 | 25 | 25 | 25 |
| Solderability | Good | Good | Exc. | Exc. | Good | None | None | None | None | None |
| Adhexion, p.s.i | 942 | 950 | 710 | 700 | 800 | (*) | (*) | (*) | (*) | (*) |
| Resistance, ohms per sq. per mil | 0.060 | 0.060 | 0.045 | 0.040 | 0.068 | 0.110 | 0.133 | 0.088 | 0.095 | 0.110 |

*Since it was impossible to solder a wire lead to the fired on film, no adhesion determination was made.

It can be seen from the tabulated data that the conductor compositions of Examples 1 to 15 are well suited for use in making fired on conductive films having highly desirable soldering, adhesion, and electrical characteristics. They are particularly well suited for use in connecting fired on palladium-based circuit components such as resistors, since they yield noise-free, firmly adherent joints. In contrast, the compositions of Examples 16 to 20 gave fired on films which exhibited much greater resistance and could not be soldered with the solder containing 60% lead and 40% tin.

The embodiments of the invention in which an exclusive property or privilege is claimed are as follows:

1. A composition adapted to be applied to and fired on a dielectric ceramic base to form thereon an electrically conductive, adherent and solderable fired on film, said composition consisting essentially of 8 to 25% finely divided palladium, 55 to 84% finely divided gold and 8 to 37% finely divided vitreous binder.

2. A composition adapted to be applied to and fired on a dielectric ceramic base to form thereon an electrically conductive, adherent and solderable fired on film, said composition consisting essentially of 8 to 21% finely divided palladium, 67 to 80% finely divided gold and 12 to 25% finely divided vitreous binder.

3. A composition adapted to be applied to and fired on a dielectric ceramic base to form thereon an electrically conductive, adherent and solderable fired on film, said composition consisting essentially of 8 to 15% finely divided palladium, 73 to 80% finely divided gold and 12 to 19% finely divided vitreous binder.

4. A composition adapted to be applied to and fired on a dielectric ceramic base to form thereon an electrically conductive, adherent and solderable fired on film, said composition consisting essentially of 8 to 25% finely divided palladium, 55 to 84% finely divided gold and 8 to 37% of a finely divided vitreous binder consisting essentially of 75 to 95% of $Bi_2O_3$ and 5 to 25% of a glass frit consisting essentially of 50 to 73% PbO, 5 to 30% $PbF_2$ and 13 to 27% $B_2O_3$.

5. A dispersion of a composition according to claim 1 in an inert liquid vehicle.

6. A dispersion of a composition according to claim 4 in an inert liquid vehicle.

7. An article comprising a dielectric ceramic base having fired thereon an electrically conductive solderable film consisting essentially of 8 to 25% finely divided palladium and 55 to 84% finely divided gold dispersed in 8 to 37% of glass matrix.

8. An article comprising a dielectric ceramic base having fired thereon an electrically conductive solderable film consisting essentially of 8 to 21% finely divided palladium and 67 to 80% finely divided gold dispersed in 12 to 25% of a glass matrix.

9. An article comprising a dielectric ceramic base having fired thereon an electrically conductive solderable film consisting essentially of 8 to 15% finely divided palladium and 73 to 80% finely divided gold dispersed in 12 to 19% of a glass matrix.

10. An article comprising a dielectric ceramic base having fired thereon an electrically conductive solderable film consisting essentially of 8 to 25% finely divided palladium and 55 to 84% finely divided gold dispersed in 8 to 37% of a glass matrix consisting essentially of 75 to 95% $Bi_2O_3$ and 5 to 25% of a lead fluoroborate glass frit consisting essentially of 50 to 73% PbO, 5 to 30% $PbF_2$ and 13 to 27% $B_2O_3$.

References Cited

UNITED STATES PATENTS

| | | | |
|---|---|---|---|
| 2,924,540 | 2/1960 | D'Andrea | 252—514 X |
| 2,950,996 | 8/1960 | Place et al. | 252—514 X |
| 3,154,503 | 10/1964 | Janakirama-Rao | 252—514 |

LEON D. ROSDOL, *Primary Examiner.*

J. D. WELSH, *Assistant Examiner.*

UNITED STATES PATENT OFFICE

CERTIFICATE OF CORRECTION

Patent No. 3,347,799 October 17, 1967

Charles W. Wagner

It is hereby certified that error appears in the above numbered patent requiring correction and that the said Letters Patent should read as corrected below.

Column 3, line 32, for "$PlCl_2$" read -- $PdCl_2$ --; column 4, line 7, for "conducor" read -- conductor --; line 68, for "value" read -- values --; column 5, line 17, for "Adhexion" read -- Adhesion --; columns 5 and 6, Table 2, eleventh column of the lower portion, line 7 thereof, for "0.110" read -- 0.100 --; column 6, line 31, after "of" insert -- a --.

Signed and sealed this 5th day of November 1968.

(SEAL)
Attest:

Edward M. Fletcher, Jr.
Attesting Officer

EDWARD J. BRENNER
Commissioner of Patents